(12) United States Patent
Ota

(10) Patent No.: US 10,877,069 B2
(45) Date of Patent: Dec. 29, 2020

(54) INSPECTION JIG, SUBSTRATE INSPECTION DEVICE, AND METHOD FOR MANUFACTURING INSPECTION JIG

(71) Applicant: Nidec-Read Corporation, Kyoto (JP)

(72) Inventor: Norihiro Ota, Kyoto (JP)

(73) Assignee: Nidec-Read Corporation, Kyoto (JP)

( * ) Notice: Subject to any disclaimer, the term of this patent is extended or adjusted under 35 U.S.C. 154(b) by 50 days.

(21) Appl. No.: 16/319,826

(22) PCT Filed: Jul. 24, 2017

(86) PCT No.: PCT/JP2017/026632
§ 371 (c)(1),
(2) Date: Jan. 23, 2019

(87) PCT Pub. No.: WO2018/021216
PCT Pub. Date: Feb. 1, 2018

(65) Prior Publication Data
US 2019/0265276 A1     Aug. 29, 2019

(30) Foreign Application Priority Data
Jul. 28, 2016   (JP) .................. 2016-148507

(51) Int. Cl.
*G01R 1/073*     (2006.01)
*G01R 3/00*      (2006.01)
(Continued)

(52) U.S. Cl.
CPC ......... *G01R 1/07378* (2013.01); *G01R 1/073* (2013.01); *G01R 1/07314* (2013.01);
(Continued)

(58) Field of Classification Search
None
See application file for complete search history.

(56) References Cited

U.S. PATENT DOCUMENTS 4,734,046 A * 3/1988 McAllister ............. G01R 1/073
439/101
6,084,419 A * 7/2000 Sato .................. G01R 31/2886
324/750.03
(Continued)

FOREIGN PATENT DOCUMENTS

JP     H05302938     11/1993
JP     H05341007     12/1993
(Continued)

OTHER PUBLICATIONS

"International Search Report (Form PCT/ISA/210) of PCT/JP2017/026632," dated Oct. 3, 2017, with English translation thereof, pp. 1-4.

*Primary Examiner* — Jas A Sanghera
(74) *Attorney, Agent, or Firm* — JCIPRNET

(57) ABSTRACT

This inspection jig is provided with: a plurality of probes (Pr) for bringing leading end portions (Pra) thereof into contact with a plurality of inspection points on a substrate (100); a support member (300) that supports the probes (Pr) in a state wherein the leading end portions (Pra) are disposed to be in contact with the inspection points on the substrate (100) respectively; device-side connecting terminals (36) electrically connected to an inspection device main body (2); a plurality of standard disposition electrodes (332), which are conducted to the device-side connecting terminals (36), and are disposed in previously set standard disposition; and a conversion block (31), which has a first surface (311) and a second surface (312) on sides opposite to each other, and in which first electrodes (E1) are formed on the first surface (311), and in which second electrodes (E2) are formed on the second surface (312).

14 Claims, 7 Drawing Sheets

(51) Int. Cl.
  *G01R 31/28* (2006.01)
  *G01R 31/50* (2020.01)

(52) U.S. Cl.
  CPC .............. *G01R 3/00* (2013.01); *G01R 31/28* (2013.01); *G01R 31/50* (2020.01)

(56) References Cited

U.S. PATENT DOCUMENTS

| | | | | |
|---|---|---|---|---|
| 6,292,003 | B1* | 9/2001 | Fredrickson | G01R 1/0483 324/750.25 |
| 2004/0051541 | A1* | 3/2004 | Zhou | G01R 1/07378 324/756.03 |
| 2004/0124519 | A1* | 7/2004 | Zhou | G01R 1/07378 257/686 |
| 2006/0154500 | A1* | 7/2006 | Igarashi | G01R 1/07378 439/86 |
| 2008/0197866 | A1* | 8/2008 | Jo | G01R 1/06738 324/754.03 |
| 2017/0023615 | A1* | 1/2017 | Ekin | H05K 1/0296 |

FOREIGN PATENT DOCUMENTS

| | | |
|---|---|---|
| JP | 2002257856 | 9/2002 |
| JP | 2005172603 | 6/2005 |
| JP | 2010060310 | 3/2010 |
| WO | 2015109208 | 7/2015 |

* cited by examiner

INSPECTION JIG, SUBSTRATE INSPECTION DEVICE, AND METHOD FOR MANUFACTURING INSPECTION JIG

CROSS-REFERENCE TO RELATED APPLICATION

This application is a 371 application of the International PCT application serial no. PCT/JP2017/026632, filed on Jul. 24, 2017, which claims the priority benefits of Japan Patent Application No. 2016-148507, filed on Jul. 28, 2016. The entirety of each of the above-mentioned patent applications is hereby incorporated by reference herein and made a part of this specification.

TECHNICAL FIELD

The present invention relates to an inspection jig configured to bring a probe in contact with an inspection object, a substrate inspection device including a inspection jig thereof, and a method for manufacturing the inspection jig.

BACKGROUND ART

In the related art, an inspection device configured to allow inspection of an inspection object to be performed by bringing a plurality of probes disposed in a multi-acicular in contact with a plurality of inspection points on an inspection object such as a printed circuit board, a semiconductor board, or the like, is known. In addition, an inspection jig including a jig head configured to hold such a multi-acicular probe and configured to electrically connect the probe to an inspection device main body is known.

Incidentally, in recent years, in the above-mentioned inspection device in which a pitch of the inspection points is extremely small or the number of inspection points is also large, for example, several thousands of probes are used. In addition, connecting terminals (electrodes) on the inspection device main body side need to have a large form to some extent and be disposed at intervals larger than disposition intervals of the inspection points from the viewpoint of ease of manufacturing, connection reliability, and durability. For this reason, the probes and the inspection device main body cannot be directly connected. Here, the probes and the inspection device main body are connected by wire cables.

However, since the disposition of the inspection points also varies when the inspection object is changed, there is a need to rebuild a jig head that holds the probe when the inspection object is changed. When the jig head is rebuilt, the wire cables need to be connected again, and the work of connecting thousands of cables is generated. Therefore, the number of man-hours required for connecting the cables is a heavy burden.

Here, a substrate inspection device including a pitch conversion block configured to convert an disposition interval of inspection points into an disposition interval of electrodes on a side of the inspection device is known (for example, see Patent Literature 1). Patent Literature 1 discloses a technology of standardizing a pitch conversion block by providing an arrangement of upper surface electrodes and arrangement of lower surface electrodes of the pitch conversion block in a conventional grid shape, matching leading end sides of the probes with the disposition of the inspection points, and providing the disposition of base end sides in contact with the upper surface electrodes of the probes in a conventional grid shape.

CITATION LIST

Patent Literature

[Patent Literature 1]
Japanese Unexamined Patent Application Publication No. 2005-172603

SUMMARY OF INVENTION

Incidentally, according to the technology disclosed in Patent Literature 1, the disposition of leading end sides of a multi-acicular probe needs to match with the disposition of inspection points, and the disposition of base end sides of the multi-acicular probe needs to be a disposition at intersection positions of a previously created conventional grid shape. However, since a degree of freedom of the disposition of the probe base end sides decreases as a density of the inspection points increases, as miniaturization of inspection objects progresses the inspection objects that are difficult to make the disposition of the probe base end sides into a conventional grid shape are increased. Since the inspection objects that are difficult to make the disposition of the probe base end sides into the conventional grid shape cannot be detected, a degree of freedom of inspection targets may be decreased.

An objective of the present invention is to provide an inspection jig, a substrate inspection device, and a method for manufacturing an inspection jig, in which the inspection objects that can be inspection targets is able to be increased, while the number of man-hours for connection of cables between probes and an inspection device main body when the inspection objects are changed is able to be reduced.

An inspection jig according to an aspect of the present invention is an inspection jig configured to conduct a plurality of inspection points provided on an inspection object with respect to an inspection device main body configured to electrically inspect the inspection object, the inspection jig including a plurality of probes having a substantially bar shape and configured to bring leading edge portions thereof in contact with the plurality of inspection points; a support member configured to support the plurality of probes in a state in which the plurality of leading edge portions are disposed to come in contact with the plurality of inspection points respectively; a plurality of device-side connecting terminals electrically connected to the inspection device main body; a plurality of standard disposition electrodes conducted to the plurality of device-side connecting terminals and disposed with a standard disposition that is previously set; and a conversion block having a first surface and a second surface that face each other and in which a plurality of first electrodes disposed to come in contact with rear ends of the plurality of probes are formed on the first surface and a plurality of second electrodes conducted to the plurality of first electrodes and disposed to correspond to the standard disposition are formed on the second surface.

DESCRIPTION OF EMBODIMENTS

Figure 1:
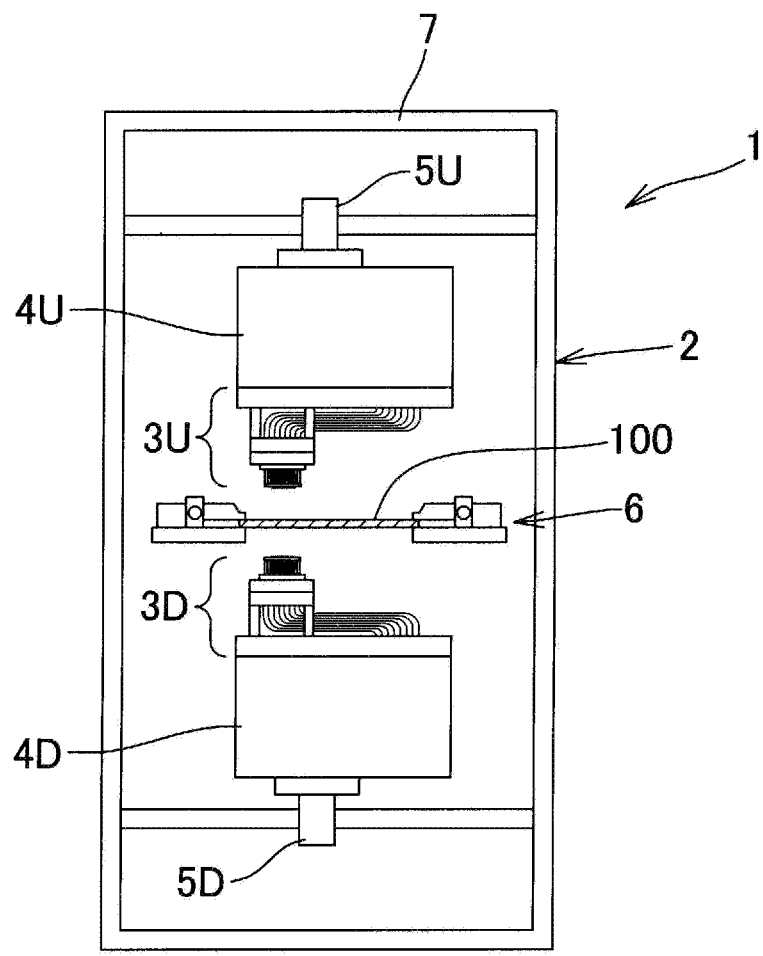
FIG. 1 is a front view schematically showing a configuration of a substrate inspection device including an inspection jig according to an embodiment of the present invention.

Hereinafter, embodiments according to the present invention will be described with reference to the accompanying drawings. Further, components designated by the same reference numerals in the drawings indicate the same components, and description thereof will be omitted.

First Embodiment

FIG. 1 is a front view schematically showing a configuration of a substrate inspection device 1 including an inspection jig according to an embodiment of the present invention. The substrate inspection device 1 shown in FIG. 1 is a device configured to inspect a circuit pattern formed on a board 100 that is an inspection object.

The board 100 may be, for example, a semiconductor board, a printed circuit board, a flexible board, a ceramic multi-layered wiring board, an electrode plate for a liquid crystal display, a plasma display or an electro-luminescence (EL) display, and various boards such as a package board for a semiconductor package, a film carrier, or the like. A plurality of inspection points with which probes come in contact are appropriately created on, for example, a pad, an electrode, a terminal, a wiring pattern, or the like, formed on the board 100. Since a disposition of the inspection points is determined according to a wiring pattern or the like formed on the board 100, when the board 100 is changed to a different type (a different model), the disposition of the inspection points is varied.

The substrate inspection device 1 shown in FIG. 1 includes an inspection device main body 2, and inspection jigs 3U and 3D. The inspection device main body 2 mainly includes inspection sections 4U and 4D, inspection section moving mechanisms 5U and 5D, a board fixing device 6, and a housing 7 configured to accommodate these parts. The board fixing device 6 is configured to fix the board 100 that is an inspection target to a predetermined position. The inspection section moving mechanisms 5U and 5D appropriately move the inspection sections 4U and 4D in the housing 7.

The inspection section 4U is disposed above the board 100 fixed to the board fixing device 6. The inspection section 4D is disposed below the board 100 fixed to the board fixing device 6. The inspection sections 4U and 4D are configured to attach and detach the inspection jigs 3U and 3D configured to inspect a circuit pattern formed on the board 100. Hereinafter, the inspection sections 4U and 4D are generally referred to as an inspection section 4.

Figure 2:
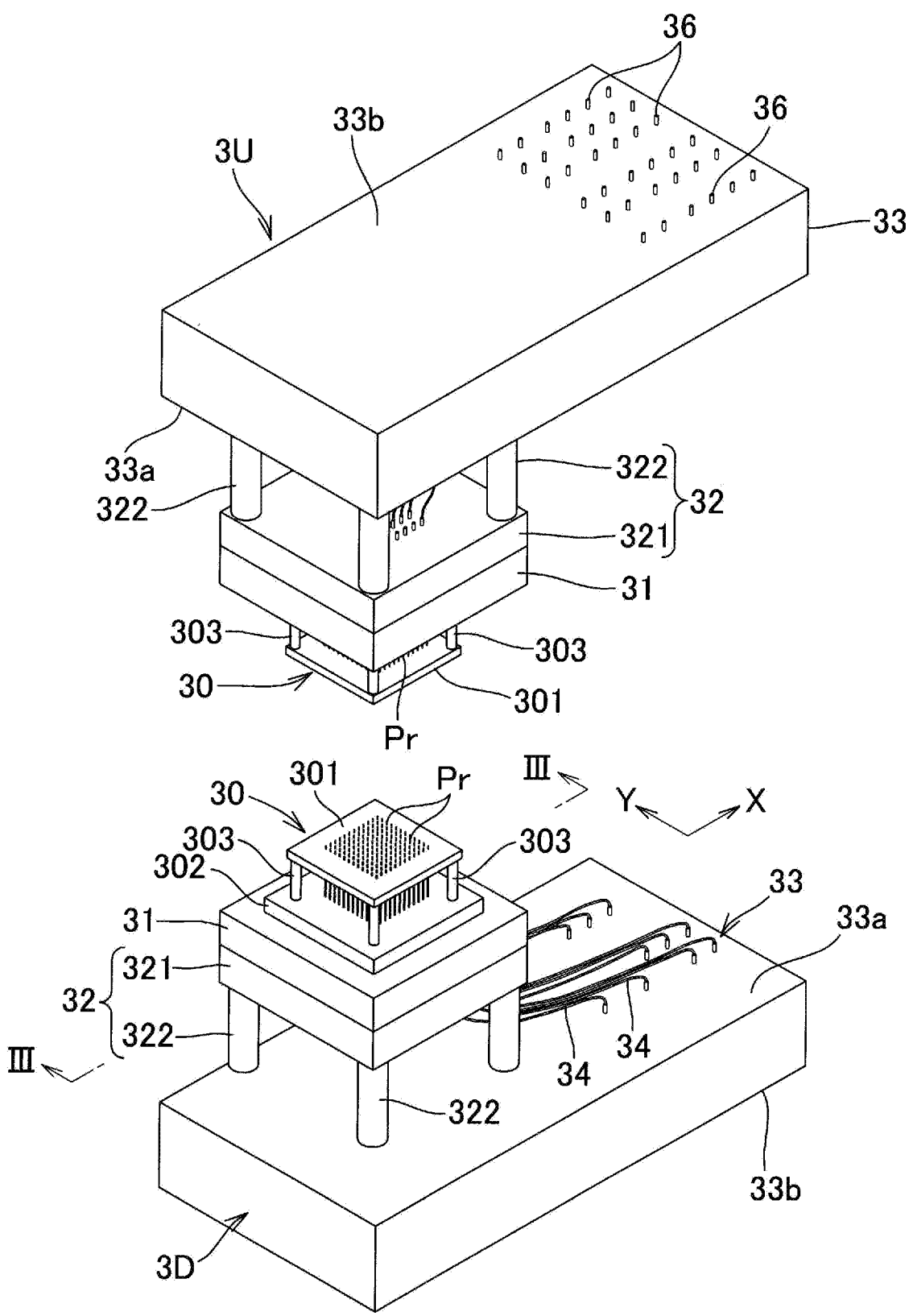
FIG. 2 is a perspective view showing an example of a configuration of the inspection jig shown in FIG. 1.

FIG. 2 is a perspective view showing an example of a configuration of the inspection jigs 3U and 3D shown in FIG. 1. Since the inspection jig 3U is configured to have the same configuration as the inspection jig 3D except that upward and downward directions are different therefrom, description thereof will be omitted. Hereinafter, the inspection jigs 3U and 3D are generated referred to as an inspection jig 3.

Figure 3:
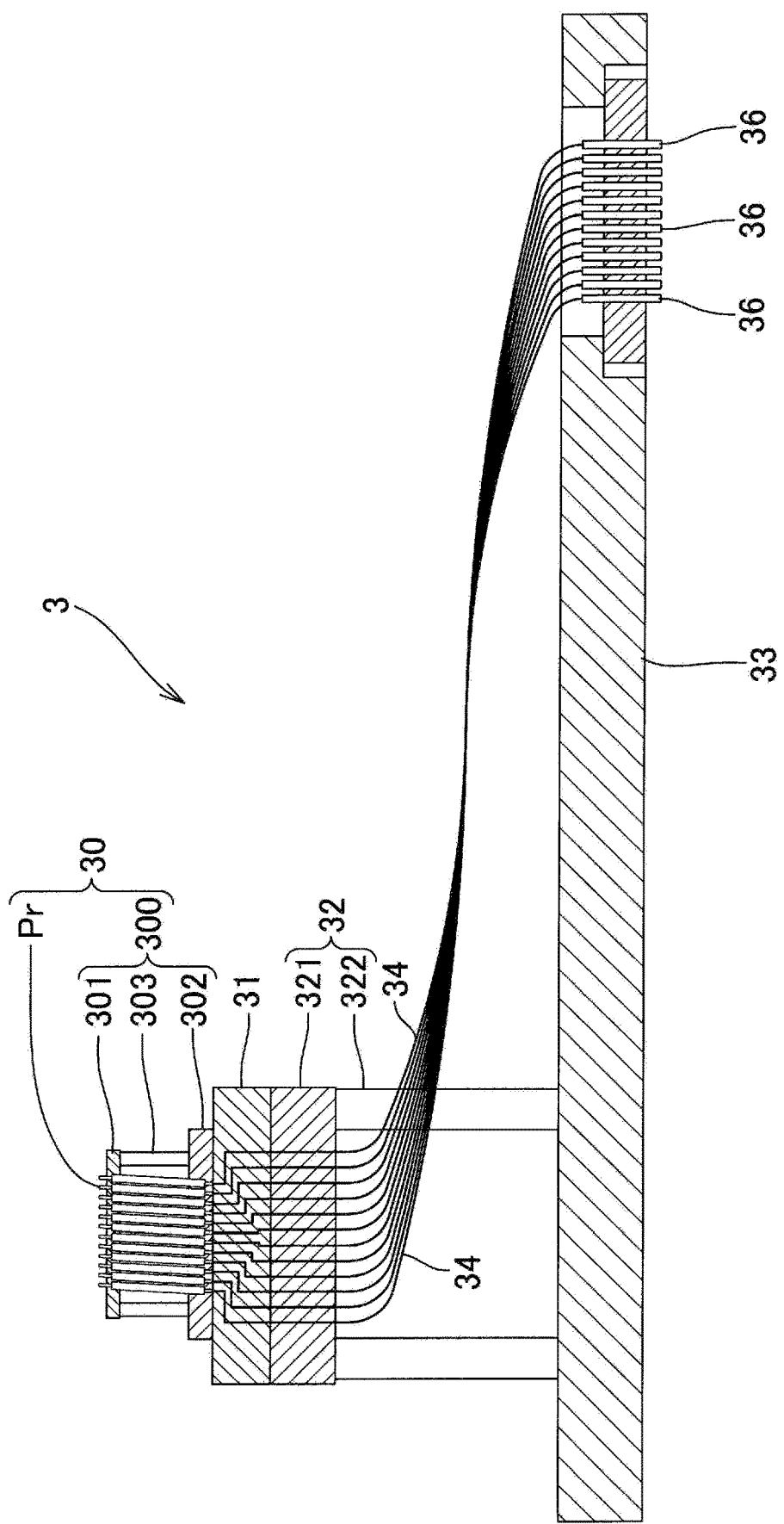
FIG. 3 is a cross-sectional view taken along line III-III of the inspection jig shown in FIG. 2.

FIG. 3 is a cross-sectional view taken along line III-III of the inspection jig 3 shown in FIG. 2. The inspection jig 3 includes a jig head 30, a conversion block 31, a support base 32, a base 33, and a plurality of wire cables 34.

The base 33 is a substantially plate-shaped member attached to the inspection device main body 2. A plurality of device-side connecting terminals 36 electrically connected to the inspection device main body 2 are attached to the base 33. One ends of the wire cables 34 are connected to the device-side connecting terminals 36. The support base 32 includes a base plate 321 having substantially a plate shape, and a plurality of connecting rods 322 configured to connect the base plate 321 such that it is kept apart from the base 33. For example, four connecting rods 322 may be attached to four corners of the base plate 321.

Figure 4:
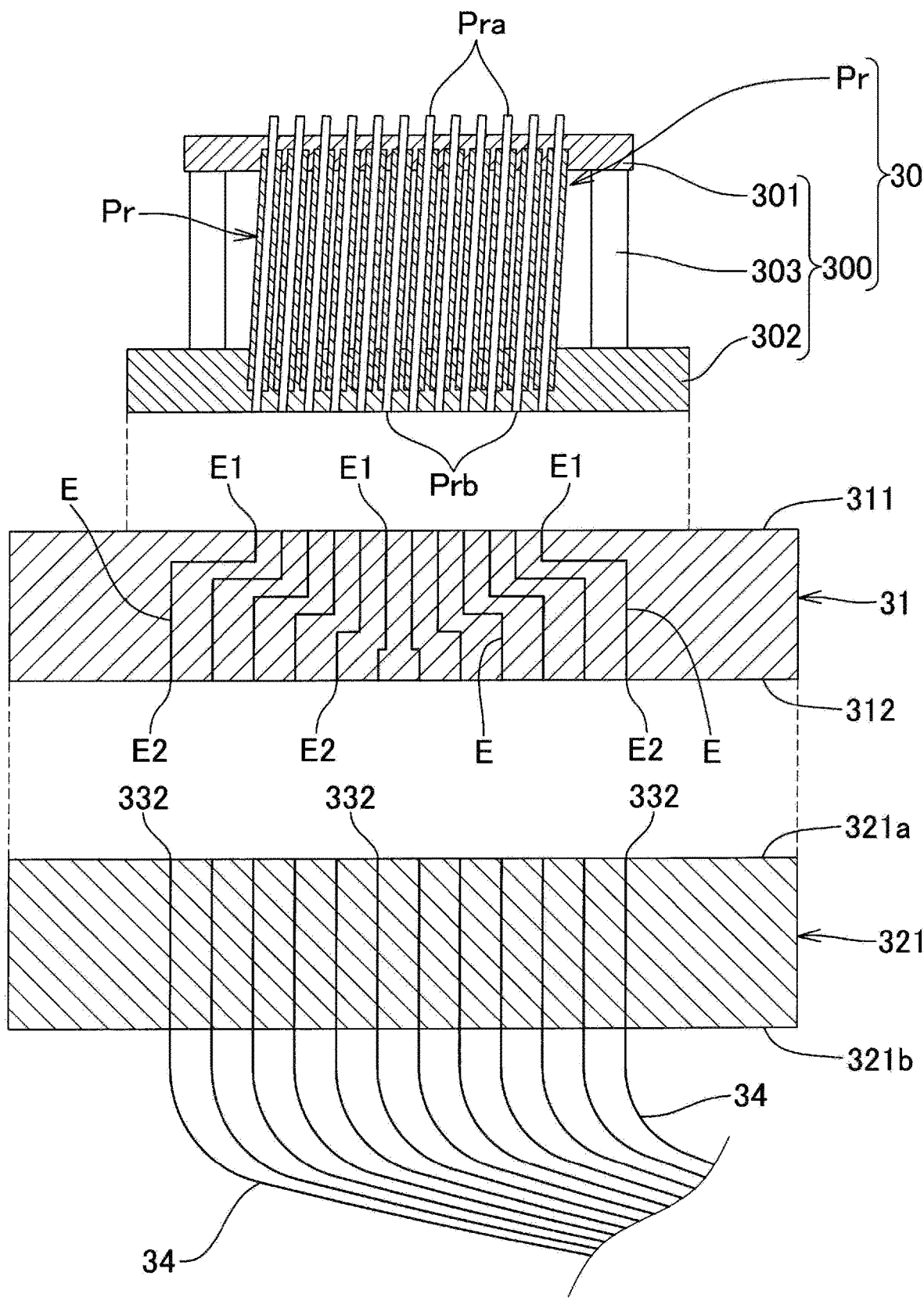
FIG. 4 is an exploded and enlarged view illustrating configurations of a jig head, a conversion block and a base plate shown in FIG. 3.

FIG. 4 is an exploded and enlarged view for describing configurations of the jig head 30, the conversion block 31 and the base plate 321 shown in FIG. 3. The base plate 321 has a front surface 321a and a back surface 321b. One ends of the plurality of wire cables 34 are inserted into the base plate 321 from the back surface 321b side to pass through the base plate 321 in a thickness direction thereof. The front surface 321a of the base plate 321 is polished flat such that end surfaces of the wire cables 34 are exposed. The end surfaces of the wire cables 34 become standard disposition electrodes 332. The standard disposition electrodes 332 are disposed to have a standard disposition that is previously set. In the standard disposition, conventionally, a pitch between the standard disposition electrodes 332 is larger than a pitch between the inspection points on the board 100.

For example, the conversion block 31 has a substantially rectangular parallelepiped shape that is flat, and includes a first surface 311 and a second surface 312, which face each other. The conversion block 31 is attached to the base plate 321 such that the second surface 312 is disposed on a side of the base plate 321. The conversion block 31 is detachably attached to the base plate 321 by an attachment means such as bolts or the like.

A plurality of first electrodes E1 are formed on the first surface 311 of the conversion block 31, and a plurality of second electrodes E2 are formed on the second surface 312 of the conversion block 31. As described below, the plurality of first electrodes E1 are formed on the first surface 311 to be disposed to come in contact with rear end portions Prb of a plurality of probes Pr supported by a support member 300 and to correspond to disposition of the rear end portions Prb of the probes Pr. The plurality of second electrodes E2 are disposed on the second surface 312 to correspond to the standard disposition to come in contact with the plurality of standard disposition electrodes 332. The plurality of first electrodes E1 and the plurality of second electrodes E2 are respectively connected and conducted by wirings E.

When the conversion block 31 is attached to the base plate 321, the plurality of second electrodes E2 come in contact with and are conducted to the plurality of standard disposition electrodes 332 respectively. Further, a sheet having conductivity only in a thickness direction, which is a so-called anisotropic conductive sheet or anisotropic conductive rubber sheet, may be sandwiched between the front surface 321a of the base plate 321 and the second surface 312 of the conversion block 31. In addition, the second electrodes E2 may be configured using a spring pin configured to cause the pin to protrude using a biasing force of a spring, a so-called Pogo pin. Accordingly, contact stability between the second electrodes E2 and the standard disposition electrodes 332 can be improved.

The jig head 30 includes the plurality of probes Pr, and the support member 300 configured to support the plurality of probes Pr. Outer circumferences of the probes Pr except for leading edge portions Pra and the rear end portions Prb are insulated and coated, and the leading edge portions Pra and the rear end portions Prb are exposed without being insulated and coated. The support member 300 includes a plate-shaped head plate 301 that is disposed to face the board 100, a plate-shaped support plate 302 that is disposed to face the head plate 301, and a plurality of columns 303 configured to support the head plate 301 and the support plate 302 such that it is kept apart from each other substantially parallel to each other. For example, four columns 303 are attached to four corners of the head plate 301.

A plurality of through-holes are formed in the head plate 301 to correspond to disposition of the inspection points provided on the board 100. A plurality of through-holes are formed in the support plate 302 to correspond to the plurality of through-holes formed in the head plate 301. Then, the leading end sides of each of the probes Pr are inserted through the through-holes of the head plate 301, rear end sides of each of the probes Pr are inserted through the through-holes of the support plate 302, and each of the probes Pr are supported by the support member 300.

The jig head 30 is detachably attached to the conversion block 31 by an attachment means such as a bolt or the like. When the jig head 30 is attached to the conversion block 31, since the first electrodes E1 are disposed to correspond to disposition of the rear end portions Prb of the probes Pr, the rear end portions Prb of the plurality of probes Pr come in contact with the plurality of first electrodes E1 respectively. The leading edge portions Pra slightly protrude from a front surface of the head plate 301.

Since the leading edge portions Pra are positioned by the through-holes formed in the head plate 301 to correspond to disposition of the inspection points on the board 100, the leading edge portions Pra are disposed to correspond to disposition of the inspection points on the board 100. As a result, when the jig head 30 abuts the board 100, the leading edge portions Pra of each of the probes Pr abut the inspection points on the board 100 and the leading edge portions Pra at which the probes Pr are bent by pressing forces thereof to protrude are pushed into the head plate 301. As a result, each of the leading edge portions Pra elastically abut each of the inspection points due to elastic recovering forces generated due to bending of each of the probes Pr, and contact stability between the inspection point and each of the probes Pr is improved.

Accordingly, according to the inspection jig 3, each of the inspection points on the board 100 is conducted and connected to the inspection device main body 2 via the probes Pr, the first electrodes E1, the wirings E, the second electrodes E2, the standard disposition electrodes 332, the wire cables 34, and the device-side connecting terminals 36. As a result, the inspection device main body 2 can electrically inspect the board 100.

Here, since the support member 300 needs to dispose the leading edge portions Pra of the probes Pr according to disposition of the inspection points on the board 100, there is a need to rebuild the support member 300 if the board 100 is changed. Here, in the manner in which the base end portions of the probes are disposed at the intersection positions of the conventional grid to come in contact with the electrodes of the pitch conversion block as in the background art, when a density of the inspection points on the board is high, it is not possible to only change the disposition of the probe leading edge portions and dispose the probe rear end portions at intersection positions in a conventional grid shape, and thus, such a board cannot be inspected using the inspection device main body.

However, according to the inspection jig 3, since the first electrodes E1 of the conversion block 31 are disposed to correspond to disposition of the rear end portions Prb of the probes Pr, i.e., the conversion block 31 is fabricated according to change of the support member 300, inspection objects that can become inspection target are easily increased.

In addition, since the standard disposition electrodes 332 formed on the front surface 321a of the base plate 321 are disposed with standard disposition that is previously set and the second electrodes E2 of the conversion block 31 are formed to correspond to the standard disposition, a newly fabricated conversion block 31 can be exchanged with the previous conversion block 31 to be conducted and connected to the base plate 321. If there is no need to exchange the base plate 321, since a wiring work of the wire cables 34 also does not occur, cable connecting man-hours of the probes and the inspection device main body when the inspection object is changed can be reduced.

Since the conversion block 31 can freely wire the first electrodes E1 and the second electrodes E2 differently from the jig head 30 that achieves conduction using the probes Pr having substantially bar shapes, the first electrodes E1 disposed to correspond to disposition of the rear end portions Prb of the probes Pr are easily conducted to the second electrodes E2 disposed to correspond to the standard disposition.

Next, an example of a method of manufacturing the inspection jig 3 configured as described above will be described. The inspection jig 3 can be fabricated by a support member fabricating process, a probe holding process, a first assembly process, and a second assembly process, which will be described below in brief.

(1) Support Member Fabricating Process

The support member 300 is fabricated to correspond to disposition of the plurality of inspection points formed on the board 100 that becomes an inspection target.

(2) Probe Holding Process

The plurality of probes Pr are held by the support member 300, and the jig head 30 corresponding to the board 100 is fabricated.

(3) Conversion Block Fabricating Process

The conversion block 31 is fabricated by making the plurality of first electrodes E1 correspond to the disposition of the rear end portions Prb of the plurality of probes Pr and making the plurality of second electrodes E2 correspond to a standard disposition. Accordingly, the conversion block 31 in which the standard disposition electrodes 332 can be connected to the base plate 321 disposed with the standard disposition while corresponding to inspection of the board 100 is obtained.

(4) First Assembly Process

The jig head 30 is attached to the conversion block 31 to bring the rear end portions Prb of the plurality of probes Pr in contact with the plurality of first electrodes E1.

(5) Second Assembly Process

The conversion block 31 is attached to the base plate 321 to bring the plurality of second electrodes E2 of the conversion block 31 in contact with the plurality of standard disposition electrodes 332.

Further, each of the processes of (1) to (5) may be performed in an arbitrary execution procedure except that (2) the probe holding process is performed after (1) the support member fabricating process.

Next, (3) the conversion block fabricating process will be described in more detail. For example, the conversion block 31 can be formed by laminating a plurality of connecting boards such as printed circuit boards or the like, in which a via extending in a direction perpendicular to the first surface 311 and a wiring pattern connected to the via and extending in a direction parallel to the first surface 311 are formed. In this case, the wirings E are configured by connecting the via and the wiring pattern of each of the connecting boards. Various organic or inorganic materials may be used as a material of the connecting board, and for example, an insulating material such as a resin, ceramic, glass epoxy, glass, or the like, may be used.

Alternatively, the conversion block 31 may be fabricated by, for example, a 3-dimensional printer (a 3D printer). Various methods can be employed as a method for the three-dimensional printer, and for example, as disclosed in Patent Literature 1, "an optical shaping method" using an optical shaping device, "a heat melting lamination method" of taking out a resin melted through heating little by little from a top of a thin nozzle and forming a shape while laminating the resin, "a powder shaping method" of heating and fixing a powdered resin or the like as a raw material using a high output laser beam, "a sheet lamination method" of forming a sheet-shaped material through cutting-out and stacking using a laser bean or a cutter, or other various three-dimensional shaping methods may be used.

According to these manufacturing methods, the conversion block 31 according to disposition of the inspection points on the board 100 can be easily fabricated.

Second Embodiment

Figure 5:
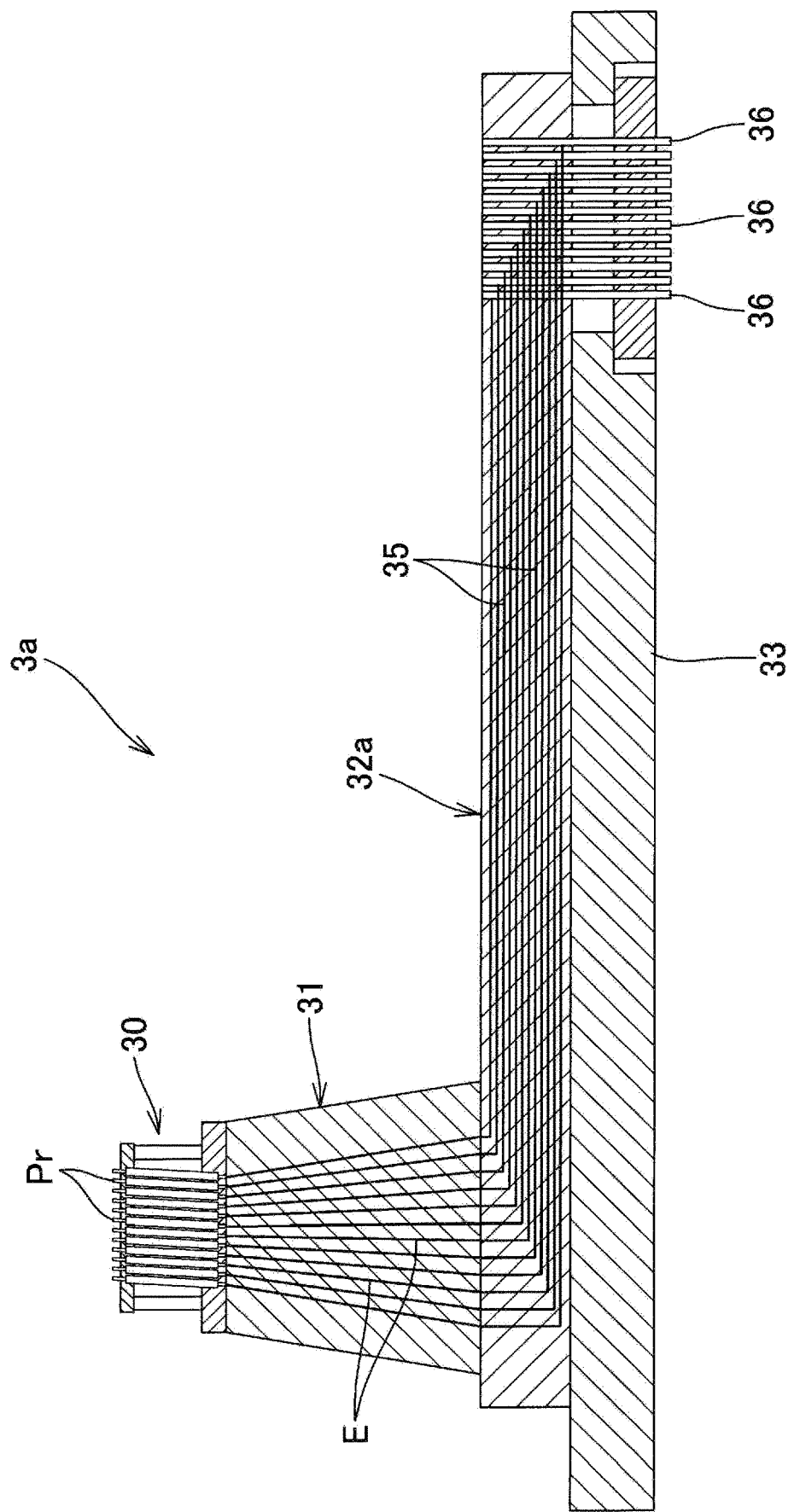
FIG. 5 is a cross-sectional view showing an example of a configuration of an inspection jig according to a second embodiment of the present invention.
Figure 6:
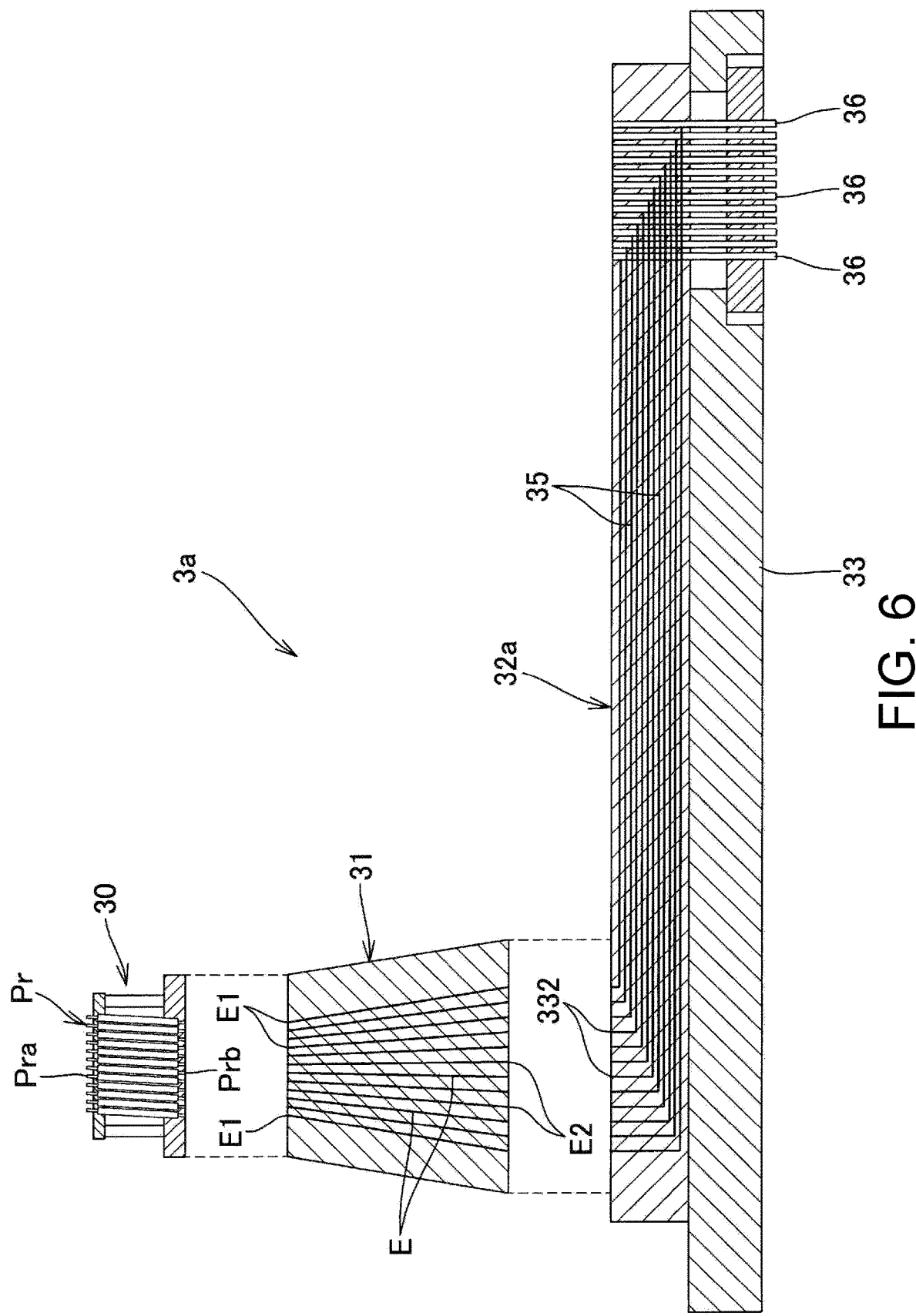
FIG. 6 is an exploded view for describing the inspection jig shown in FIG. 5.

Next, an inspection jig according to a second embodiment of the present invention will be described. FIG. 5 is a cross-sectional view showing an example of a configuration of an inspection jig 3a according to the second embodiment of the present invention. FIG. 6 is an exploded view for describing the inspection jig shown in FIG. 5. The inspection jig 3a shown in FIGS. 5 and 6 are distinguished from the inspection jig 3 shown in FIGS. 3 and 4 in that the device-side connecting terminals 36 and the second electrodes E2 are connected using a printed circuit board instead of the support base 32 and the wire cables 34. Since the configuration is otherwise the same as that of the inspection jig 3 shown in FIGS. 3 and 4, description thereof will be omitted, and characteristic points on the embodiment will be described below.

The inspection jig 3a shown in FIG. 5 includes a base board 32a instead of the support base 32 and the wire cables 34 in the inspection jig 3 shown in FIG. 3. The base board 32a is constituted by a single or multi-layered printed circuit board. One end of a wiring pattern 35 formed on the base board 32a is connected to the device-side connecting terminals 36 via, for example, a through-hole. The base board 32a is disposed to face the second surface 312 of the conversion block 31, and extends in a direction perpendicular to the facing direction.

Further, while the conversion block 31 shown in FIGS. 5 and 6 shows an example of a cross-sectional structure assumed as being manufactured by a three-dimensional printer, it also can be constituted by a laminated board as shown in FIGS. 3 and 4.

As shown in FIG. 6, the plurality of standard disposition electrodes 332 constituted by, for example, pads or lands, and arranged with standard disposition are formed on a surface of the base board 32a facing the conversion block 31. The plurality of standard disposition electrodes 332 are disposed to face the plurality of second electrodes E2 on the second surface 312 of the base board 32a. The plurality of device-side connecting terminals 36 are disposed on the base board 32a at positions separated from the positions at which the plurality of standard disposition electrodes 332 are formed in a direction perpendicular to the facing direction in which the conversion block 31 and the base board 32a face each other. The standard disposition electrodes 332 and the device-side connecting terminals 36 are connected by the wiring pattern 35 respectively.

Accordingly, when the conversion block 31 is attached to the base board 32a, the standard disposition electrodes 332 of the base board 32a and the second electrodes E2 of the conversion block 31 come in contact with each other, and the probes Pr and the device-side connecting terminals 36 can be conducted to each other.

According to the inspection jig 3a, there is no need of a wiring work of the wire cables 34, and the number of manufacturing processes of the inspection jig 3a can be reduced.

Figure 7:
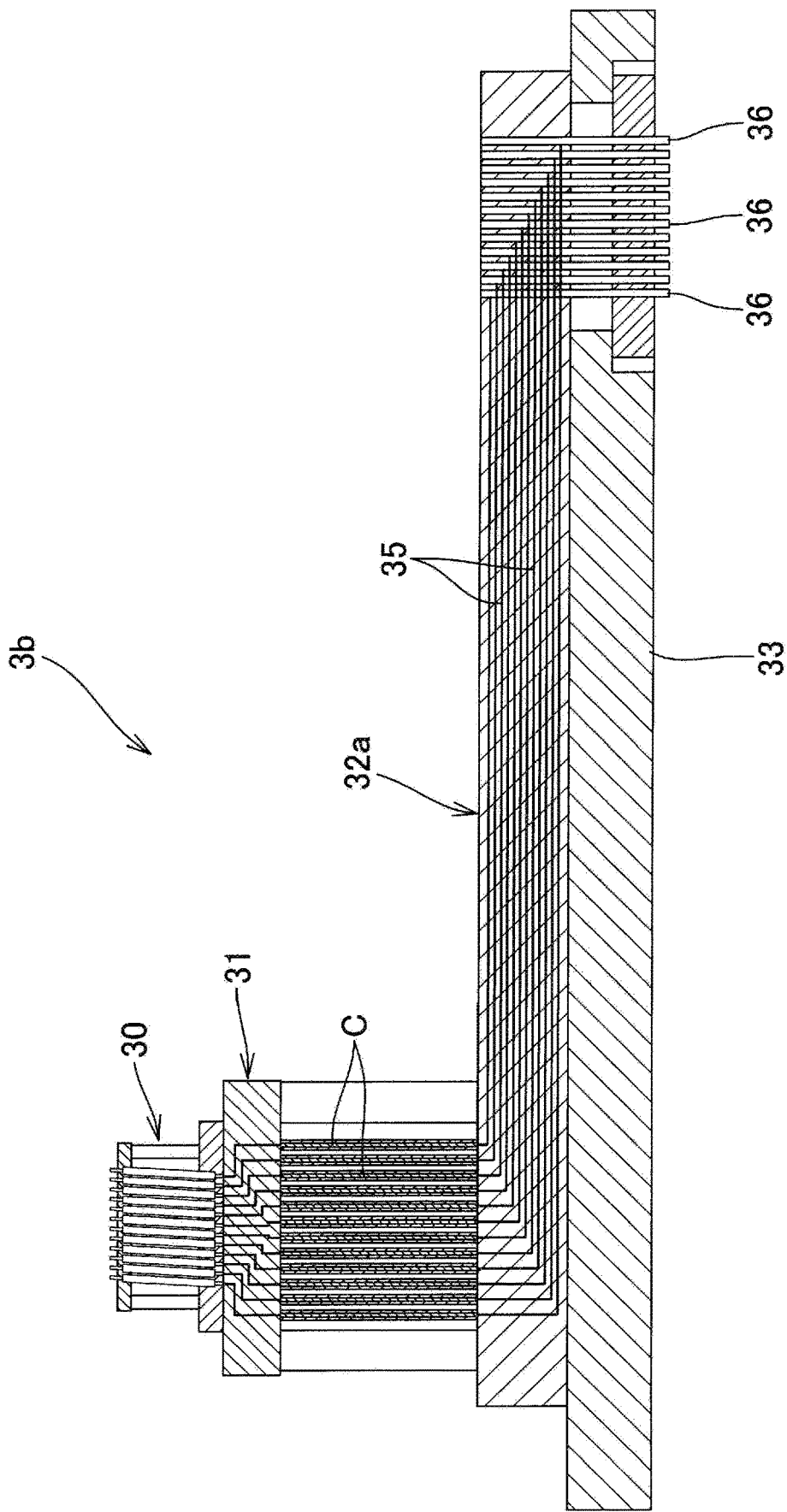
FIG. 7 is a view for describing a variant of the inspection jig shown in FIG. 5.

Further, as shown in FIG. 7, there may be a configuration in which the second electrodes E2 of the conversion block 31 and the standard disposition electrodes 332 of the base board 32a are connected by a connecting means C such as a wire cable, a bar-shaped conductive pin, or the like. Accordingly, since a distance from the base board 32a to the jig head 30 can be adjusted according to the length of the connecting means C, the inspection positions of the board 100 can be easily adjusted.

That is, an inspection jig according to an aspect of the present invention is an inspection jig configured to conduct a plurality of inspection points provided on an inspection object with respect to an inspection device main body configured to electrically inspect the inspection object, the inspection jig including a plurality of probes having a substantially bar shape and configured to bring leading edge portions thereof in contact with the plurality of inspection points, a support member configured to support the plurality of probes in a state in which the plurality of leading edge portions are disposed to come in contact with the plurality of inspection points, a plurality of device-side connecting terminals electrically connected to the inspection device main body, a plurality of standard disposition electrodes conducted to the plurality of device-side connecting terminals and disposed with a standard disposition that is previously set, and a conversion block having a first surface and a second surface that face each other and in which a plurality of first electrodes disposed to come in contact with rear ends of the plurality of probes are formed on the first surface and a plurality of second electrodes conducted to the plurality of first electrodes and disposed to correspond to the standard disposition are formed on the second surface.

According to the configuration, since the support member supports the leading edge portions of the plurality of probes while being disposed to come in contact with the plurality of inspection points, when disposition of the inspection points is varied as the inspection object is changed, the support member will be rebuilt according to disposition of the inspection points. Since the first electrodes of the conversion block are disposed to come in contact with the rear ends of the probes, i.e., the conversion block is fabricated according to a change of the support member, the inspection objects that can become inspection targets can be easily increased. In addition, since the standard disposition electrodes are disposed with the standard disposition that is previously set and the second electrodes of the conversion block are formed to correspond to the standard disposition, the probes and the device-side connecting terminal can be conducted by only exchanging a previous conversion block with a newly fabricated conversion block. Accordingly, since a wiring work of the wire cables does not occur even when the inspection object is changed, cable connecting man-hours of the probes and the inspection device main body when the inspection object is changed can be reduced.

In addition, a printed circuit board disposed to face the second surfaces of the conversion block and extending in a direction perpendicular to the facing direction may be further provided, the plurality of standard disposition electrodes may be formed on a surface of the printed circuit board facing the second surface to face the plurality of second electrodes, the plurality of device-side connecting terminals may be disposed on the printed circuit board at positions separated from the positions at which the plurality of standard disposition electrodes are formed in the perpendicular direction, and the plurality of device-side connecting terminals and the plurality of standard disposition electrodes may be conducted and connected by a plurality of wiring patterns of the printed circuit board, respectively.

According to the configuration, since work of connecting with wire cables does not occur from the start, the number of manufacturing processes of the inspection jig can be reduced. In addition, since the device-side connecting terminals are disposed at positions separated from the positions at which the standard disposition electrodes are formed in a direction perpendicular to the direction in which conversion block and the printed circuit board face each other, positions of the device-side connecting terminals can be easily adjusted by appropriately setting the separation space. As a result, a positional deviation between the connecting position of the inspection device main body and the second electrode of the conversion block can be easily absorbed by the printed circuit board.

In addition, a plurality of bar-shaped conductive pins that respectively conduct and connect the plurality of standard disposition electrodes and the plurality of second electrodes may be further provided.

According to the configuration, since the standard disposition electrodes and the second electrodes can be conducted according to a distance between the standard disposition electrodes and the second electrodes, i.e., a facing distance between the conversion block and the printed circuit board, by appropriately setting a length of the conductive body pin, a degree of freedom of disposition of the conversion block and the printed circuit board is improved.

In addition, a plurality of wire cables configured to conduct and connect the plurality of standard disposition electrodes and the plurality of second electrodes, respectively, may be further provided.

According to the configuration, since the standard disposition electrodes and the second electrodes can be conducted according to a distance between the standard disposition electrodes and the second electrodes, i.e., a facing distance between the conversion block and the printed circuit board and a positional deviation between the facing direction and the perpendicular direction by appropriately setting a length of the wire cable, a degree of freedom of disposition of the conversion block and the printed circuit board is improved.

In addition, the plurality of device-side connecting terminals and the plurality of standard disposition electrodes may be conducted and connected by wire cables.

Since the wire cable can be bent or twisted, directions of the probes supported by the plurality of standard disposition electrodes, the conversion block and the support member can be easily changed integrally.

In addition, a substrate inspection device according to an aspect of the present invention includes the above-mentioned inspection jig and the inspection device main body.

According to the configuration, a substrate inspection device capable of easily increasing inspection objects that can become inspection targets while reducing cable connecting man-hours of the probes and the inspection device main body when the inspection objects are changed is obtained.

In addition, a method for manufacturing an inspection jig according to an aspect of the present invention is the method for manufacturing above-mentioned inspection jig, the method including a support member fabricating process of fabricating the support member to correspond to the disposition of the plurality of inspection points, a probe holding process of holding the plurality of probes on the support member, a conversion block fabricating process of fabricating the conversion block by corresponding the plurality of first electrodes to the disposition of rear ends of the plurality of probes and corresponding the plurality of second electrodes to the standard disposition, a first assembly process of bringing the rear ends of the plurality of probes in contact with the plurality of first electrodes, and a second assembly process of bringing the plurality of second electrodes of the conversion block in contact with the plurality of standard disposition electrodes.

According to the manufacturing method, the above-mentioned inspection jig can be manufactured.

In addition, the conversion block fabricating process may be a process of fabricating the conversion block using a 3-dimensional printer.

According to the manufacturing method, the conversion block according to the disposition of inspection points of inspection objects can be easily fabricated.

In addition, the conversion block fabricating process may be a process of fabricating the conversion block by laminating multiple of connecting boards, in each of which a via and a wiring pattern connected to the via and extending in a surface direction are formed.

According to the manufacturing method, the conversion block according to disposition of inspection points of inspection objects can be easily fabricated.

The inspection jig and the substrate inspection device having the above-mentioned configuration can easily increase inspection objects that can become inspection targets while reducing cable connecting man-hours of the probes and the inspection device main body when the inspection object is changed. In addition, the above-mentioned method for manufacturing an inspection jig is appropriate for manufacturing of the inspection jig capable of easily increasing the inspection objects that can become inspection targets while reducing cable connecting man-hours of the probes and the inspection device main body when the inspection objects are changed.

The application is based on Japanese Patent Application No. 2016-148507, filed on Jul. 28, 20166, the content of which is incorporated herein by reference. Further, specific embodiments or examples made in the mode of carrying out the invention merely clarify the technical spirit of the present invention, and the present invention is not limited only to such specific examples and should not be interpreted narrowly.

The invention claimed is:

1. An inspection jig configured to conduct a plurality of inspection points provided on an inspection object with respect to an inspection device main body configured to electrically inspect the inspection object, the inspection jig comprising:
    a plurality of probes having a substantially bar shape and configured to bring leading edge portions thereof in contact with the plurality of inspection points;
    a support member configured to support the plurality of probes in a state in which the leading edge portions are disposed to come in contact with the plurality of inspection points respectively;
    a plurality of device-side connecting terminals electrically connectable to the inspection device main body;
    a plurality of standard disposition electrodes conducted to the plurality of device-side connecting terminals and disposed with a standard disposition that is previously set;
    a conversion block having a first surface and a second surface that face each other and in which a plurality of first electrodes disposed to come in contact with rear ends of the plurality of probes are formed on the first surface and a plurality of second electrodes conducted to the plurality of first electrodes and disposed to correspond to the standard disposition are formed on the second surface; and
    a base configured to be attached to the inspection device main body, wherein the plurality of device-side connecting terminals electrically connectable to the inspection device main body are attached to the base.

2. The inspection jig according to claim 1, further comprising a printed circuit board disposed to face the second surface of the conversion block and extending in a perpendicular direction perpendicular to a facing direction,
    wherein the plurality of standard disposition electrodes are formed on a surface of the printed circuit board facing the second surface to face the plurality of second electrodes,
    the plurality of device-side connecting terminals are disposed on the printed circuit board at positions separated from positions at which the plurality of standard disposition electrodes are formed in the perpendicular direction, and
    the plurality of device-side connecting terminals and the plurality of standard disposition electrodes are conducted and connected by a plurality of wiring patterns of the printed circuit board, respectively.

3. The inspection jig according to claim 2, further comprising a plurality of bar-shaped conductive pins that conduct and connect the plurality of standard disposition electrodes and the plurality of second electrodes, respectively.

4. The inspection jig according to claim 2, further comprising a plurality of wire cables configured to conduct and connect the plurality of standard disposition electrodes and the plurality of second electrodes, respectively.

5. The inspection jig according to claim 1, wherein the plurality of device-side connecting terminals and the plurality of standard disposition electrodes are conducted and connected by wire cables.

6. A substrate inspection device comprising:
    the inspection jig according to claim 1; and
    the inspection device main body.

7. A method for manufacturing the inspection jig according to claim 1, the method comprising:
    a support member fabricating process of fabricating the support member to correspond to disposition of the plurality of inspection points;
    a probe holding process of holding the plurality of probes on the support member;
    a conversion block fabricating process of fabricating the conversion block by corresponding the plurality of first electrodes to disposition of rear ends of the plurality of probes and corresponding the plurality of second electrodes to the standard disposition;
    a first assembly process of bringing the rear ends of the plurality of probes in contact with the plurality of first electrodes; and
    a second assembly process of bringing the plurality of second electrodes of the conversion block in contact with the plurality of standard disposition electrodes.

8. The method for manufacturing the inspection jig according to claim 7, wherein the conversion block fabricating process is a process of fabricating the conversion block using a 3-dimensional printer.

9. The method for manufacturing the inspection jig according to claim 7, wherein the conversion block fabricating process is a process of fabricating the conversion block by laminating multiple of connecting boards, in each of which a via and a wiring pattern connected to the via and extending in a surface direction are formed.

10. An inspection jig configured to conduct a plurality of inspection points provided on an inspection object with respect to an inspection device main body configured to electrically inspect the inspection object, the inspection jig comprising:
    a plurality of probes configured to bring leading edge portions thereof in contact with the plurality of inspection points;
    a support member configured to support the plurality of probes in a state in which the leading edge portions are disposed to come in contact with the plurality of inspection points respectively;
    a plurality of device-side connecting terminals electrically connectable to the inspection device main body;
    a plurality of standard disposition electrodes conducted to the plurality of device-side connecting terminals and disposed with a standard disposition that is previously set; and
    a conversion block having a first surface and a second surface that face each other and in which a plurality of first electrodes disposed to come in contact with rear ends of the plurality of probes are formed on the first surface and a plurality of second electrodes conducted to the plurality of first electrodes and disposed to correspond to the standard disposition are formed on the second surface,
    wherein the plurality of device-side connecting terminals and the plurality of standard disposition electrodes are conducted and connected by wire cables.

11. A substrate inspection device comprising:
    the inspection jig according to claim 10; and
    the inspection device main body.

12. A method for manufacturing the inspection jig according to claim 10, the method comprising:
    a support member fabricating process of fabricating the support member to correspond to disposition of the plurality of inspection points;
    a probe holding process of holding the plurality of probes on the support member;
    a conversion block fabricating process of fabricating the conversion block by corresponding the plurality of first electrodes to disposition of rear ends of the plurality of probes and corresponding the plurality of second electrodes to the standard disposition;

a first assembly process of bringing the rear ends of the plurality of probes in contact with the plurality of first electrodes; and a second assembly process of bringing the plurality of second electrodes of the conversion block in contact with the plurality of standard disposition electrodes.

13. The method for manufacturing the inspection jig according to claim 12, wherein the conversion block fabricating process is a process of fabricating the conversion block using a 3-dimensional printer.

14. The method for manufacturing the inspection jig according to claim 12, wherein the conversion block fabricating process is a process of fabricating the conversion block by laminating multiple of connecting boards, in each of which a via and a wiring pattern connected to the via and extending in a surface direction are formed.

* * * * *